United States Patent
Yoo et al.

(10) Patent No.: US 6,822,920 B2
(45) Date of Patent: Nov. 23, 2004

(54) SRAM-COMPATIBLE MEMORY DEVICE EMPLOYING DRAM CELLS

(75) Inventors: In Sun Yoo, Icheon-si (KR); Sun Hyoung Lee, Seoul (KR); Dong Woo Shin, Icheon-si (KR)

(73) Assignee: Silicon7 Inc. (KR)

( * ) Notice: Subject to any disclaimer, the term of this patent is extended or adjusted under 35 U.S.C. 154(b) by 0 days.

(21) Appl. No.: 10/639,922

(22) Filed: Aug. 12, 2003

(65) Prior Publication Data

US 2004/0042327 A1 Mar. 4, 2004

(30) Foreign Application Priority Data

Aug. 27, 2002 (KR) .................................... 2002-0050917

(51) Int. Cl.[7] ............................................... G11C 7/00
(52) U.S. Cl. ........................ 365/222; 365/149; 365/233
(58) Field of Search ................................. 365/222, 149, 365/233, 154

(56) References Cited

U.S. PATENT DOCUMENTS 5,550,781 A * 8/1996 Sugawara et al. .......... 365/222
6,201,728 B1 * 3/2001 Narui et al. ................ 365/149
6,370,052 B1 * 4/2002 Hsu et al. ................... 365/154

* cited by examiner

Primary Examiner—Huan Hoang
(74) Attorney, Agent, or Firm—Cantor Colburn LLP

(57) ABSTRACT

Disclosed herein is a synchronous SRAM-compatible memory using DRAM cells. In the synchronous SRAM-compatible memory of the present invention, a refresh operation is controlled in response to a refresh clock signal having a period "n" times a period of a reference clock signal. The refresh operation is performed while a chip enable signal/CS is inactivated. A writing/reading access operation is performed in response to a writing/reading command generated while the chip enable signal/CS is activated. Therefore, in the writing/reading access operation of the synchronous SRAM-compatible memory of the present invention, no delay of time occurs that would otherwise occur due to the refresh operation of the DRAM cells.

10 Claims, 5 Drawing Sheets

SRAM-COMPATIBLE MEMORY DEVICE EMPLOYING DRAM CELLS

BACKGROUND OF THE INVENTION

1. Field of the Invention

The present invention relates to a semiconductor memory device, and more particularly to a memory device compatible with synchronous static random access memory devices, which employs dynamic random access memory cells.

2. Description of the Related Art

Generally, random access memory (RAM) devices are classified into static RAM (SRAM) devices and dynamic RAM (DRAM) devices. A RAM device generally includes a memory array composed of a plurality of unit memory cells arranged in a matrix form defined by rows and columns, and peripheral circuits adapted to control the input/output of data to/from the unit memory cells. Each of the unit memory cells stores one bit of data. In an SRAM, each unit memory cell is implemented using four transistors that form a latch structure and two transistors that act as transmission gates. Since SRAM devices store data in unit memory cells having latch structures, no refresh operation is required to maintain the stored data. Further, the SRAM devices have the advantages of a fast operating speed and low power consumption compared to DRAM devices.

However, since each unit memory cell of an SRAM is composed of six transistors, the SRAM is disadvantageous in that it requires a large wafer area compared to a DRAM that generally has unit memory cells each implemented using a transistor and a capacitor. In more detail, in order to manufacture a semiconductor memory device of the same capacity, the SRAM requires a wafer about six to ten times larger than that of the DRAM. The necessity of such a large wafer increases the unit cost of the SRAM. When a DRAM instead of an SRAM is used to reduce the cost, a DRAM controller is additionally required to perform a periodic refresh operation. Further, the entire performance of a system is deteriorated due to the time required to perform the refresh operation and a slow operating speed.

In order to overcome the disadvantages of the DRAM and the SRAM, attempts have been made to implement an SRAM to which DRAM memory cells are applied. One of these attempts is the technology of effectively concealing a refresh operation from the outside of the memory to enable the memory to be compatible with the SRAM.

In the conventional SRAM-compatible technology, an additional time period is required for internal refresh operation within a memory access interval or memory access timing is delayed in order to obtain a time required to refresh DRAM cells of a memory array.

However, such a conventional synchronous SRAM-compatible memory is problematic in that the memory access timing for writing/reading is internally delayed, and an overall operating speed is decreased due to the delay of the access timing.

SUMMARY OF THE INVENTION

The above-discussed and other problems and deficiencies occurring in the prior art are overcome or alleviated by a synchronous SRAM-compatible memory of the present invention, which is compatible with SRAM even while exploiting DRAM memory cells, synchronizes with an external clock signal, and minimizes a decrease in operating speed due to a refresh operation.

The present invention provides a synchronous SRAM-compatible memory having a DRAM memory array including a plurality of DRAM cells arranged in a matrix form defined by rows and columns, operating in synchronization with a reference clock signal, and interfacing with an external system that simultaneously provides a row address for selecting a row of the DRAM memory array and a column address for selecting a column thereof, where the DRAM cells require a refresh operation at regular refresh periods to maintain data stored therein. The synchronous SRAM-compatible memory includes a DRAM memory array; a data input/output unit for controlling input and output of data to and from the DRAM memory array; a state control unit for controlling an operation of accessing the DRAM memory array and an operation of the data input/output unit, the state control unit receiving a chip enable signal externally provided to enable the synchronous SRAM/compatible memory device; a refresh timer for generating a refresh request signal activated at regular intervals; a clock period modulating unit for providing a pre-control signal to activate a non-executed refresh request signal, the pre-control signal being designed so that a logic state thereof transitions in response to every n-th reference clock signal generated during an inactivation interval of the chip enable signal; and a refresh control unit for generating a refresh control signal to be activated to control a refresh operation to be performed for the DRAM memory array, the refresh control signal being activated in response to transition of the pre-control signal.

The refresh control signal is activated in response to a refresh clock signal having a period "n" (n is a natural number) times a period of the reference clock signal. The period of the refresh clock signal may be 1/m (m is a natural number) of an inactivation interval of the chip enable signal.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
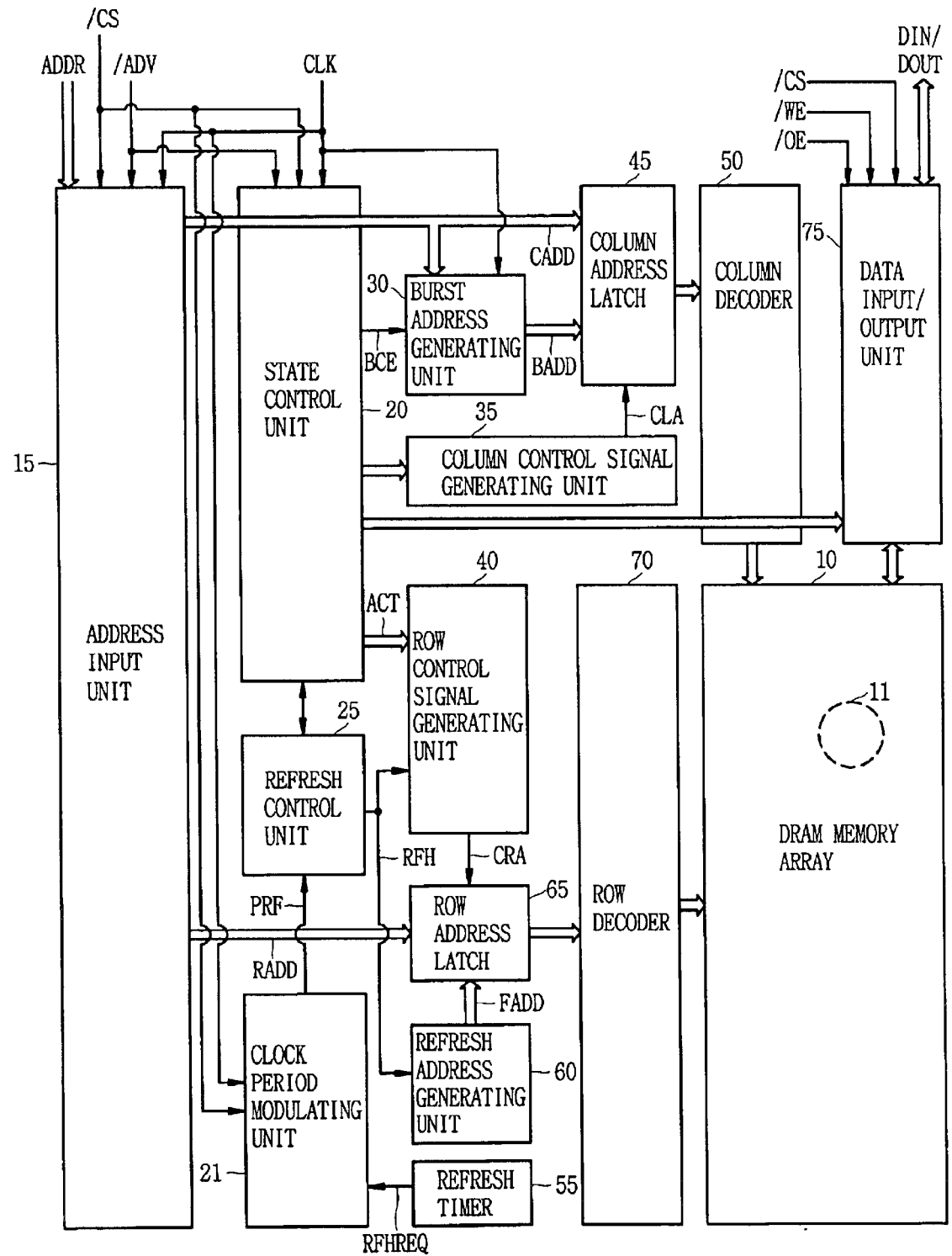
FIG. 1 is a block diagram illustrating a synchronous SRAM-compatible memory according to an embodiment of the present invention.

Reference now should be made to the drawings, in which the same reference numerals are used throughout the different drawings to designate the same or similar components.

A synchronous SRAM-compatible memory according to the present invention exploits DRAM cells and performs a refresh operation when seen from an internal standpoint, but does not allocate an operation period for the refresh operation when seen from an external standpoint. In other words, the refresh operation that is internally performed is not externally observable from the outside of the synchronous SRAM-compatible memory. Additionally, the synchronous SRAM-compatible memory does not require an external control signal for controlling a refresh operation, and can be operated according to the same rules as a general synchronous SRAM.

The refresh operation denotes the operation of activating a specific word line, outputting the data of all DRAM cells connected to the word line from the DRAM cells, amplifying the data, and writing the amplified data back in the DRAM cells.

The synchronous SRAM-compatible memory of the present invention performs a burst access operation. The burst access operation denotes the operation in which, while a word line WL is kept activated, two or more different columns are continuously selected and then data are continuously read or written even though an additional address is not input from the outside of the memory. That is, in the burst access operation, second and later accesses do not require the activation of the word line.

FIG. 1 is a block diagram illustrating a synchronous SRAM-compatible memory according to an embodiment of the present invention. The synchronous SRAM-compatible memory of the embodiment includes a DRAM memory array 10, an address input unit 15, a state control unit 20, a refresh control unit 25, a burst address generating unit 30, a refresh timer 55 and a data input/output unit 75.

Figure 2:
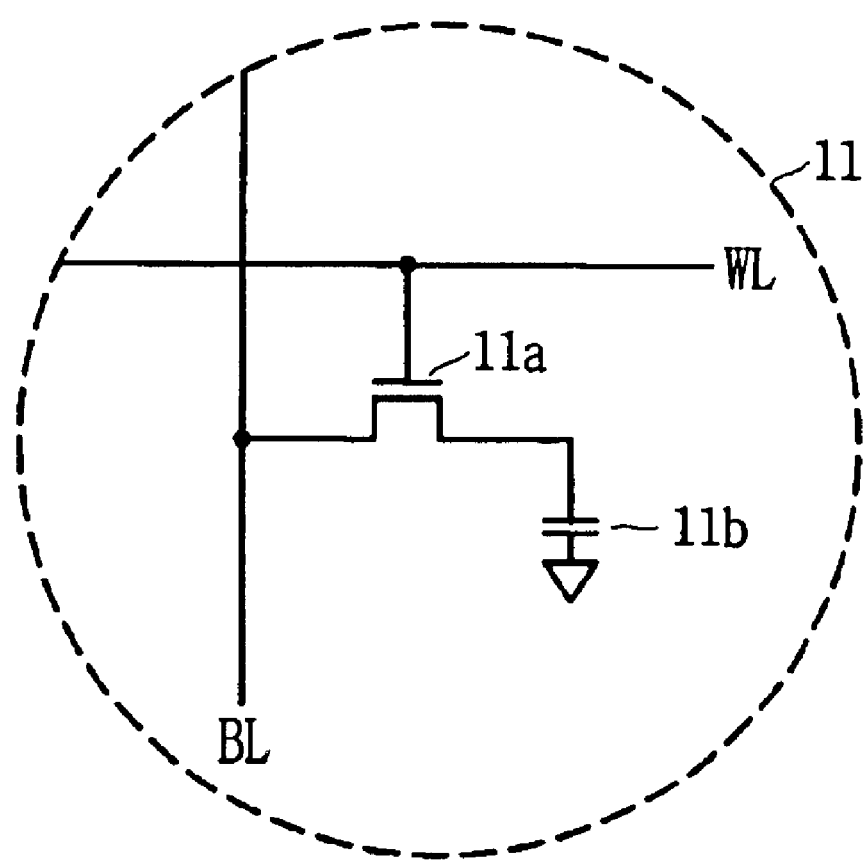
FIG. 2 is a circuit diagram showing a memory cell included in a DRAM memory array of FIG. 1.

The DRAM memory array 10 includes a plurality of memory cells 11 arranged in a matrix form defined by rows and columns. The memory cells 11 are the cells that require a refresh operation at certain intervals to maintain stored data. A typical example of such a memory cell 11 is a DRAM cell. Accordingly, for ease of description, the memory cell 11 may be referred to as a "DRAM cell" in the present specification. The DRAM cell, as shown in FIG. 2, is implemented using a transmission transistor 11a gated through a word line WL and a capacitor 11b adapted to store data of a bit line BL transmitted through the transmission transistor 11a.

The address input unit 15 effectively receives an external address ADDR in synchronization with an external clock signal CLK in the range where a chip enable signal/CS and a certain valid address signal/ADV are activated, for example, to be "LOW". That is, in the range where the valid address signal/ADV is "HIGH", the external address ADDR is not effectively input to the address input unit 15. The chip enable signal/CS is the signal that enables the synchronous SRAM-compatible memory, and is generally provided from the outside. The synchronous SRAM-compatible memory receives a row address RADD and a column address CADD at the same time, like a general SRAM. In the present specification, the row address RADD and the column address CADD may be generally referred to as an "external address ADDR."

The state control unit 20 controls an entire operation of accessing the synchronous SRAM-compatible memory of the present invention. That is, the state control unit 20 receives a chip enable signal/CS and a valid address signal/ADV, and controls the operating state of the synchronous SRAM-compatible memory while communicating with the refresh control unit 25. The chip enable signal/CS is a signal that enables the SRAM-compatible memory of the present invention. When the chip enable signal/CS is activated to be "LOW", the SRAM-compatible memory can be selectively accessed from the outside of the memory. Further, the state control unit 20 controls the data input/output unit 75.

Further, the state control unit 20 provides a burst address enable signal BCE that enables the burst address generating unit 30. The burst address enable signal BCE is activated, for example, to be "HIGH" when the synchronous SRAM-compatible memory of the present invention begins a burst access operation.

The burst address generating unit 30 is enabled in response to the activation of the burst address enable signal BCE and generates a burst address BADD that is sequentially increased with respect to the column address CADD input from the outside. The increase of the burst address BADD is implemented in synchronization with the external clock signal CLK.

A column address latch 45 selectively latches the column address CADD provided from the address input unit 15 or the burst address BADD in response to a certain column control signal CLA. The column address CADD or the burst address BADD latched by the column address latch 45 is provided to a column decoder 50.

A column control signal generating unit 35 generates the column control signal CLA, which is activated when the synchronous SRAM-compatible memory sets to the burst access operation, while communicating with the state control unit 20.

The column decoder 50 decodes the provided column address CADD or the burst address BADD and, thereby, specifies a column of the DRAM memory array 10.

The refresh timer 55 provides a refresh request signal RFHREQ activated at certain intervals to the refresh control unit 25.

The clock period modulating unit 21 generates a precontrol signal that has a transition of its logic state at every n-th clock pulse of the reference clock signal in the case where any non-executed refresh request signal REFREQ remains. In the present invention, the 'non-executed refresh request signal REFREQ' denotes a signal which is only activated by the control of the refresh timer 55 but has not executed a refresh operation corresponding to the activation thereof yet.

The refresh control unit 25 generates a refresh control signal RFH that controls a refresh operation to be performed for the DRAM memory array 10 in response to the transition of the logic state of the pre-control signal PRF.

Figure 3:
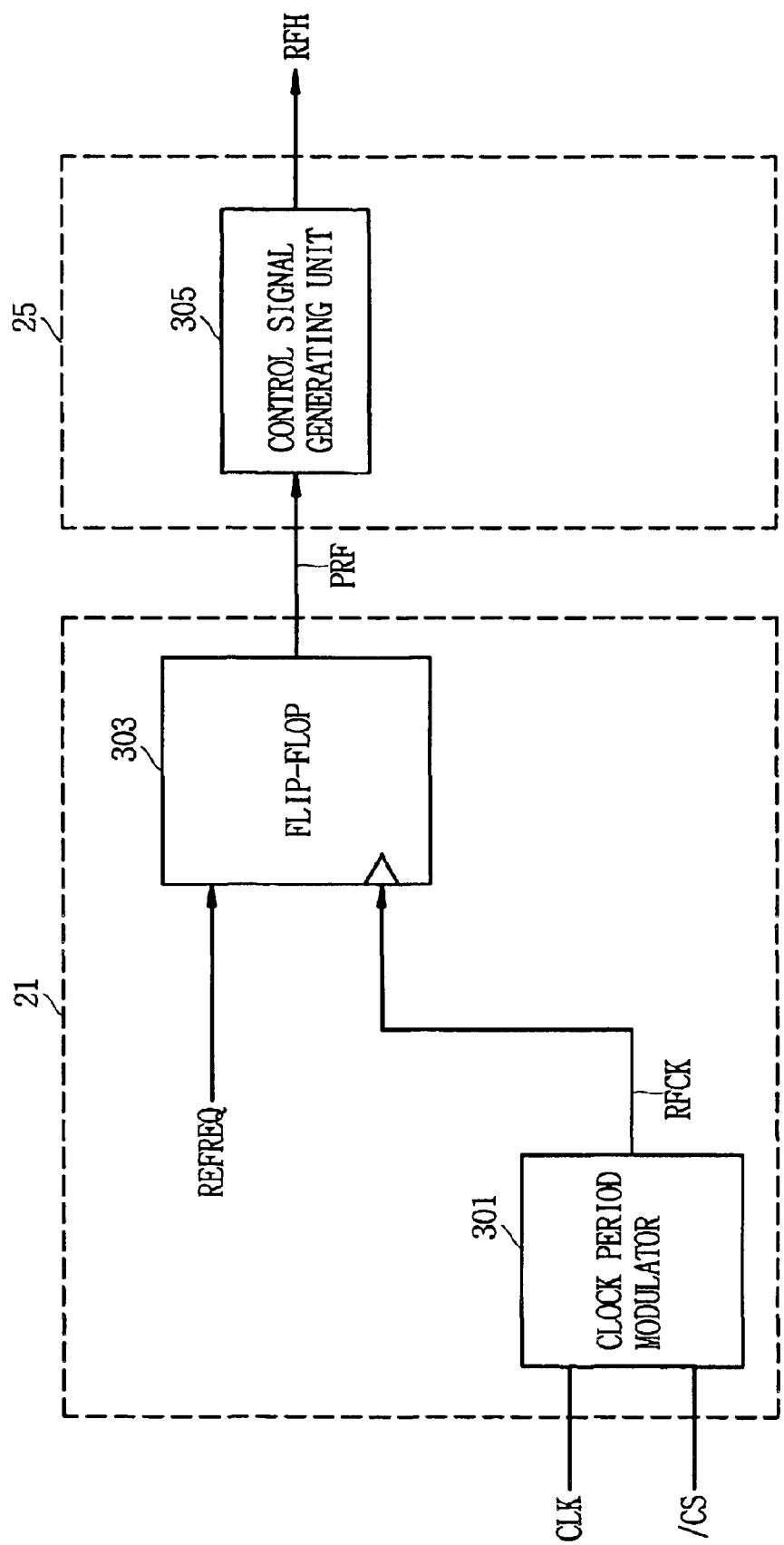
FIG. 3 is a block diagram showing a part of the components included in a clock period modulating unit and a refresh control unit of FIG. 1.

FIG. 3 is a view showing part of the components of the clock period modulating unit 21 and the refresh control unit 25 of FIG. 1. Referring to FIG. 3, the clock period modulating unit 21 comprises a clock period modulator 301 and a flip-flop 303. The refresh control unit 25 comprises a control signal generating unit 305. The clock period modulator 301 is enabled when the chip enable signal/CS is inactivated, for example, to be "HIGH", thus modulating the period of the reference clock signal CLK "n" times to generate a refresh clock signal RFCK. Preferably, "n" is a natural number equal to or greater than "2". The period of the refresh clock signal RFCK is preset, for example, to be 1/m ("m" is a natural number) of a pulse width of the inactivation period of the chip enable signal/CS.

The flipflop 303 receives the refresh request signal REFREQ as a signal input and the refresh clock signal RFCK as a clock input, and generates the pre-control signal PRF. Therefore, if the refresh request signal REFREQ is activated between a rising edge of the refresh clock signal RFCK of a previous frame and a rising edge of the refresh clock signal RFCK of a current frame, there is a transition of the logic state in the pre-control signal. Preferably, the flipflop 303 is a D flipflop.

Further, the control signal generating unit 305 generates the refresh control signal RFH activated for a predetermined period required to perform a refresh operation in response to the transition of the logic state of the pre-control signal PRF.

Consequently, the pre-control signal PRF is activated in response to the external clock signal CLK that is generated while the chip enable signal/CS is inactivated to be "HIGH", to control the refresh operation to be performed. Therefore, in the synchronous SRAM-compatible memory of the present invention, the refresh operation is performed while the chip enable signal/CS is inactivated. Further, in the synchronous SRAM-compatible memory of the present invention, a writing/reading access operation is performed in response to writing/reading commands generated while the chip enable signal/CS is activated to be "LOW". That is, in the writing/reading access operation of the synchronous SRAM-compatible memory, a delay due to the performance of the refresh operation is effectively eliminated.

Referring again to FIG. 1, the refresh control signal RFH also controls the refresh address generating unit 60. The refresh address generating unit 60 generates a refresh address FADD specifying a row of the DRAM memory array 10 in response to the refresh control signal RFH.

The row control signal generating unit 40 performs communication with both the state control unit 20 and the refresh control unit 25. The row control signal generating unit 40 generates a row control signal CRA in response to a row activation signal ACT provided from the state control unit 20 and the refresh control signal RFH provided from the refresh control unit 25. The row activation signal ACT is a signal for enabling circuits that generate signals for addressing the rows of the DRAM memory array 10 to write/read data in/from selected DRAM cell(s). For example, while the row activation control signal ACT is logic "HIGH", the synchronous SRAM-compatible memory of the present invention becomes able to perform a reading/writing access operation. At this time, the row control signal CRA becomes logic "HIGH". While the refresh control signal RFH is logic "HIGH", the row control signal CRA becomes logic "LOW" so as to allow the synchronous SRAM-compatible memory to perform a refresh operation.

A row address latch 65 selectively latches the row address RADD provided from the address input unit 15 or the refresh address FADD provided from the refresh address generating unit 60 in response to the row control signal CRA, and the latched signal is provided to a row decoder 70. For example, when the row control signal CRA is logic "HIGH", the row 10 address latch 65 latches the row address RADD provided from the address input unit 15 and provides the latched address to the row decoder 70. Further, when the row control signal CRA is logic "LOW", the row address latch 65 latches the refresh address FADD provided from the refresh address generating unit 60 and provides the latched address to the row decoder 70.

The row decoder 70 decodes the provided row address RADD or refresh address FADD and specifies a row of the memory array 10 depending on the decoded results. The data input/output unit 75 receives and outputs input data DIN and output data DOUT, respectively, in synchronization with the external clock signal CLK.

Figure 4:
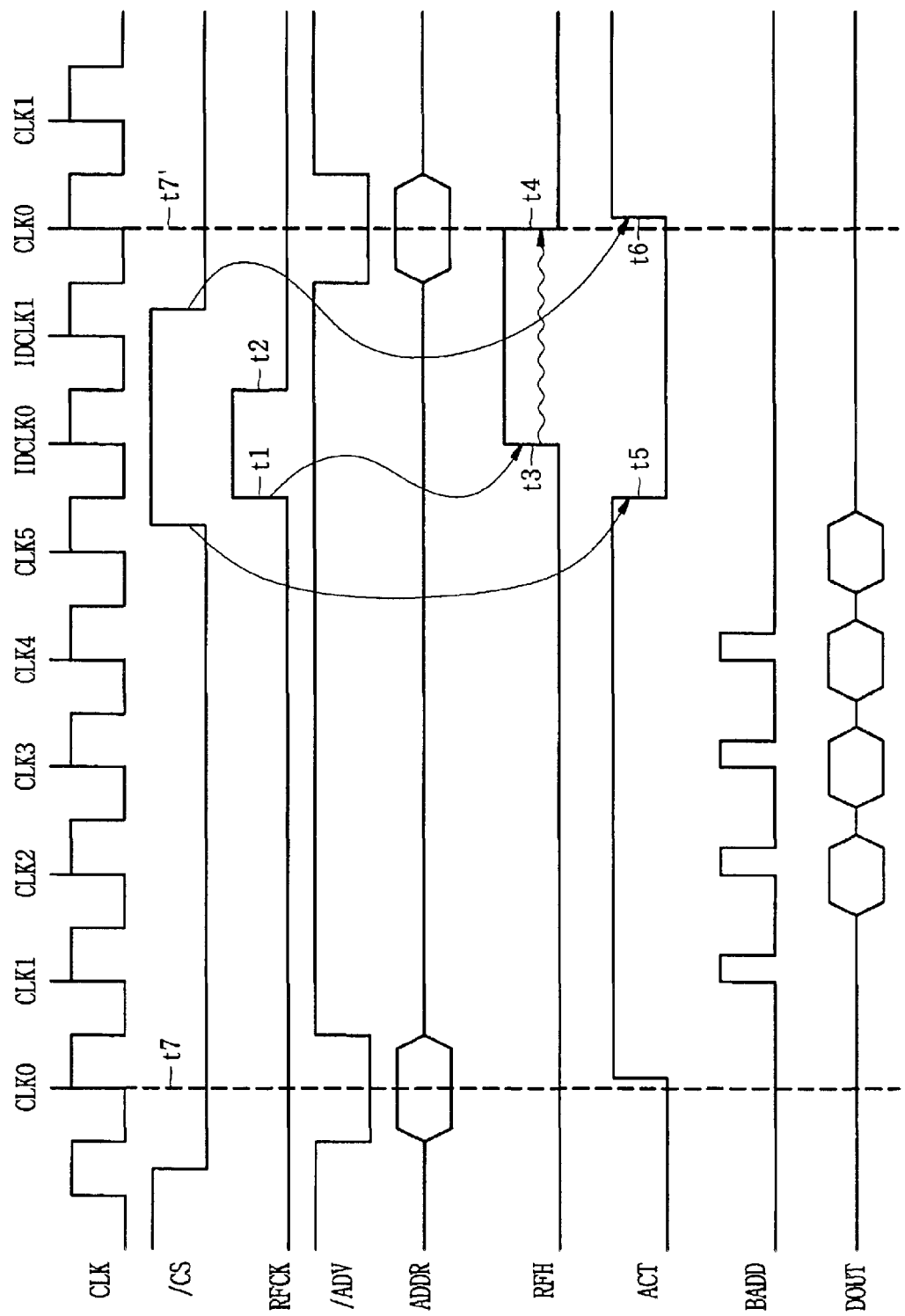
FIGS. 4 and 5 are timing diagrams each for describing an operation of the synchronous SRAM-compatible memory according to an embodiment of the present invention.

FIG. 4 is a timing diagram for describing the operation of the synchronous SRAM-compatible memory according to an embodiment of the present invention. In this embodiment, the refresh clock signal RFCK has one refresh clock pulse during the inactivation interval of the chip enable signal/CS. As shown in FIG. 4, the refresh clock signal RFCK has a logic transition from "LOW" to "HIGH" in response to the falling edge of clock pulse CLK5 of the external clock signal CLK, which is generated while the chip enable signal/CS is inactivated to be "HIGH". In the timing diagram of FIG. 4, it is assumed that a non-executed refresh request signal REFREQ is generated before time t1.

Further, the refresh clock signal RFCK has a logic transition again from "HIGH" to "LOW" in response to the falling edge of clock pulse IDCLK0 of the clock signal CLK, which is generated in an idle state. In this case, the external clock signal in the idle state (for example, clock pulse IDCLK0) designates the external clock signal CLK generated while the chip enable signal/CS is inactivated to be "HIGH". In particular, clock pulse IDCLK0 is the first clock pulse of the cl signal CLK in the idle state.

In this embodiment, the period of the refresh clock signal RFCK is twice the period of the external clock signal CLK. However, the period of the refresh clock signal RFCK can be designed to be "n" (n is a natural number) times the period of the external clock signal CLK in association with changes in the period of the external clock signal CLK and a width of the inactivation interval of the chip enable signal/CS. Further, "n" is determined to have a number such that the period of the refresh clock signal RFCK is greater than a width of the activation interval of the refresh control signal RFH. Also, for example, the period of the refresh cl signal RFCK is 1/m (m is a natural number) of the width of the inactivation interval of the chip enable signal/CS. Therefore, the falling edge of the refresh clock signal RFCK occurs while the chip enable signal/CS is inactivated to be "HIGH".

Further, the refresh control signal RFH is activated to be "HIGH" (referring to time t3) in response to the rising edge of the refresh clock signal RFCK, and then inactivated again to be "LOW" (referring to time t4) after a predetermined period of time. The row activation control signal ACT has logic transitions in response to the logic transitions of the chip enable signal/CS. For example, the row activation control signal ACT becomes logic "HIGH" at time t5 in response to the rising edge of the chip enable signal/CS and becomes logic "LOW" at time t6 in response to the falling edge of the chip enable signal/CS. In this embodiment, the activation of the refresh control signal RFH occurs within the inactivation range of the row activation control signal ACT.

Thus, the activation of the refresh control signal RFH is performed only within the inactivation range of the row activation control signal ACT. Therefore, in the synchronous SRAM-compatible memory of the present invention, a writing/reading access operation can be performed without a delay due to the performance of the refresh operation.

Further, an external address ADDR is input at times t7 and t7' when the valid address signal/ADV is activated, a burst address BADD is generated in synchronization with clock pulses CLK1, CLK2, CLK3 and CLK4 of the external clock signal CLK, and data are output from DRAM cells specified by the burst address BADD.

Figure 5:
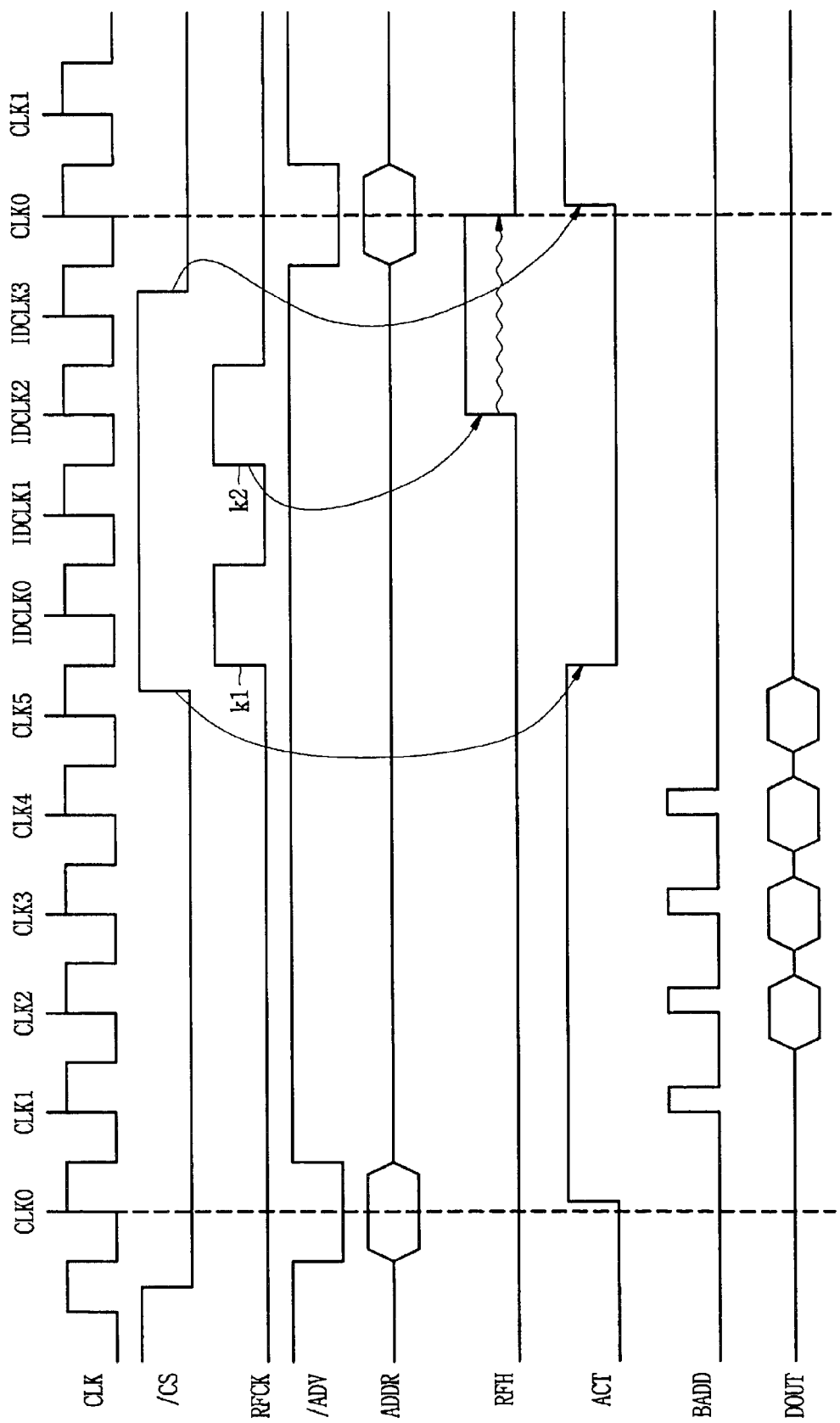

FIG. 5 is a timing diagram for describing the operation of the synchronous SRAM-compatible memory according to another embodiment of the present invention. In this embodiment, two or more refresh clock pulses RFCK are generated during the inactivation interval of the chip enable signal/CS. In FIG. 5, two refresh clock pulses are generated at time k1 and time k2, and it is assumed that a non-executed refresh request signal REFREQ is generated between a first refresh clock pulse RFCK at time k1 and a second refresh clock pulse RFCK at time k2. In this case, the refresh control signal RFH is generated in response to the second refresh clock pulse RFCK, thus performing an operation of refreshing the DRAM cells. Since the performance of the refresh operation is the same as that of the embodiment of FIG. 4, a detailed description thereof is omitted. As shown in FIG. 5, no delay occurs in a writing/reading access operation that is performed after the chip enable signal/CS has been activated, even in the case where the refresh operation is performed in response to the second refresh clock pulse RFCK.

In accordance with the synchronous SRAM-compatible memory according to the present invention, a refresh operation is performed in response to a control signal generated during an interval for which the chip is disabled. Therefore, the synchronous SRAM-compatible memory can perform a writing/reading access operation in which a delay due to the performance of a refresh operation for DRAM cells does not occur, and has a remarkably improved operating speed.

Although the above-described embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A synchronous SRAM-compatible memory device having a DRAM memory array including a plurality of DRAM cells arranged in a matrix form defined by rows and columns, and operating in synchronization with a reference cl signal, the synchronous SRAM-compatible memory device comprising:

a data input/output unit for controlling input and output of data to and from the DRAM memory array;

a state control unit for controlling an operation of accessing the DRAM memory array and an operation of the data input/output unit, the state control unit receiving a chip enable signal externally provided to enable the synchronous SRAM-compatible memory device;

a refresh timer for generating a refresh request signal activated at regular intervals;

a clock period modulating unit for providing a pre-control signal to activate a non-executed refresh request signal, the pre-control signal having a logic state transition in response to every n-th clock pulse of the reference clock signal generated during an inactivation interval of the chip enable signal; and a refresh control unit for generating a refresh control signal to control a refresh operation for the DRAM memory array, the refresh control signal being activated in response to the logic state transition of the pre-control signal.

2. The synchronous SRAM-compatible memory device as set forth in claim 1, wherein the refresh control signal is activated in response to a refresh clock signal having a period that is "n" (n is a natural number) times a period of the reference clock signal.

3. The synchronous SRAM-compatible memory device as set forth in claim 2, wherein the period of the refresh clock signal is 1/m (m is a natural number) of an inactivation interval of the chip enable signal.

4. The synchronous SRAM-compatible memory device as set forth in claim 3, wherein the "n" is a natural number equal to or greater than "2".

5. The synchronous SRAM-compatible memory device as set forth in claim 4, wherein the clock period modulating unit comprises:

clock period modulator for providing the refresh clock signal to be enabled in response to an inactivated chip enable signal and to be extended "n" times the reference clock signal; and a flip-flop for receiving the refresh request signal as a signal input and the refresh clock signal as a clock input.

6. The synchronous SRAM-compatible memory device as set forth in claim 2, wherein the "n" is a natural number equal to or greater than "2".

7. The synchronous SRAM-compatible memory device as set forth in claim 6, wherein the clock period modulating unit comprises:

clock period modulator for providing the refresh clock signal to be enabled in response to an inactivated chip enable signal and to be extended n times the reference clock signal; and a flip-flop for receiving the refresh request signal as a signal input, and the refresh clock signal as a clock input.

8. The synchronous SRAM-compatible memory device as set forth in claim 1, further including:

a burst address generating unit for generating a burst address in response to a burst address enable signal from the state control unit;

a column control signal generating unit for generating a column control signal that is activated in a burst access operation; and a column address latch for latching one of a column address externally provided and the burst address from the burst address generating unit in response to the column control signal.

9. The synchronous SRAM-compatible memory device as set forth in claim 1, further including:

a refresh address generating unit for generating a refresh address specifying a row of the DRAM memory array in response to the refresh control signal;

a row control signal generating unit for generating a row control signal in response to a row activation signal provided from the state control unit and the refresh control signal provided from the refresh control unit; and a row address latch for latching one of a row address externally provided and the refresh address from the refresh address generating unit in response to the row control signal.

10. The synchronous SRAM-compatible memory device as set forth in claim 9, wherein the refresh control signal is activated to perform a refresh operation when the row activation signal is inactive.

* * * * *